United States Patent [19]

Ishigaki et al.

[11] 4,198,609
[45] Apr. 15, 1980

[54] PHASE TRACKED LOOP FREQUENCY DEMODULATOR

[75] Inventors: Yukinobu Ishigaki; Teruo Muraoka; Masaki Hagihara; Takeo Nasu; Kunihiro Kato, all of Yokohama, Japan

[73] Assignee: Victor Company of Japan, Limited, Yokohama, Japan

[21] Appl. No.: 924,554

[22] Filed: Jul. 14, 1978

[30] Foreign Application Priority Data

Jul. 15, 1977 [JP] Japan ............................ 52-84891
Jul. 15, 1977 [JP] Japan ............................ 52-84892
Aug. 24, 1977 [JP] Japan ........................... 52-100626
Aug. 24, 1977 [JP] Japan ........................... 52-100627

[51] Int. Cl.$^2$ ........................................... H03D 3/22
[52] U.S. Cl. ................................. 329/136; 455/214; 329/137
[58] Field of Search ............... 329/134, 136, 137, 110, 329/131, 145; 325/349

[56] References Cited
U.S. PATENT DOCUMENTS

| 4,035,730 | 7/1977 | Clayton | 329/134 |
| 4,079,330 | 3/1978 | Ishigaki et al. | 329/134 |

Primary Examiner—Siegfried H. Grimm
Attorney, Agent, or Firm—Lowe, King, Price & Becker

[57] ABSTRACT

A phase tracked loop frequency demodulator having a phase comparator receptive of a frequency modulated signal and a peak-shifting filter for imparting a constant phase shift of 90° over the full range of its instantaneous frequencies in response to a feedback control signal to permit the phase comparator to compare the non-phase shifted and phase shifted signals. The carrier frequency components of the output from the comparator are eliminated by means of a second filter to derive a demodulated signal which is used as the control signal. In order to eliminate high frequency limitations of the peak-shifting filter, this filter is comprised of a variable reactance element and a complementary reactance element so connected thereto to form a resonant circuit which possesses a quadratic frequency response characteristic with a resonant peak at the upper or lower frequency end of the passband.

7 Claims, 8 Drawing Figures

PHASE TRACKED LOOP FREQUENCY DEMODULATOR

BACKGROUND OF THE INVENTION

The present invention relates generally to frequency demodulators, and particularly to a phase tracked loop (PTL) frequency demodulator wherein a feedback control signal is used to shift the frequency of the resonant peak of a filter to impart a constant phase shift to the input frequency-modulated signal over the range of the instantaneous frequencies thereof; phase comparison between the phase-shifted signal and a non-phase shifted FM signal derives an output signal.

In a CD-4 or similar system wherein frequency-modulated signals are carried on neighboring transmission channels, interference may occur between such signals through crosstalk paths generating unwanted signals which fall within the bandwidth of the channels. In order to achieve elimination of the unwanted signals, or noise, U.S. Pat. No. 4,066,972 assigned to the assignee of the present invention, discloses a phase tracked loop frequency demodulator in which the center frequency of a bandpass filter is varied in response to a feedback control signal so as to correspond to the instantaneous frequencies of a received frequency-modulated signal which passes through the filter. The received input signal is concurrently applied to a differentiator so that the differentiated output has a phase difference of 90° with respect to the input signal. The differentiator output tends to vary in amplitude as a function of frequency due to the frequency response characteristic of the differentiator. A limiter is provided to compensate for the amplitude variations to apply a constant amplitude, phase shifted signal to a comparator for comparison with the output from the bandpass filter to provide demodulation. This phase tracked loop control clearly discriminates against unwanted signals, since the loop is always in tune to the instantaneous frequencies of the wanted signal.

However, because of the circuit configuration of the circuit elements such as the variable frequency bandpass filter, differentiator and limiter, it is difficult to design a frequency demodulator which operates satisfactorily in the frequency range of FM radio and television systems without adding complexity and an increased cost.

SUMMARY OF THE INVENTION

An object of the invention is to eliminate the high frequency limitations of a phase-tracked loop demodulator.

Another object is to provide a novel phase-tracked loop frequency demodulator which is simple in design and economical to manufacture.

The invention is characterized by the use of a variable reactance element such as varactors in combination with an inductive element to provide a lowpass or highpass filter having a quadratic passband response characteristic with a resonant peak which occurs at the cutoff frequency end of the passband. In response to a feedback control signal the varactor is caused to vary its capacitance so that the frequency of the peak is shifted. The invention is characterized in that the input FM signal, when passing through the filter, undergoes a phase shift of 90° over the range of the instantaneous frequencies of the FM signal. This permits the phase shifted signal to be directly compared in phase with the non-phase shifted incoming FM signal to deliver an output signal. The use of varactors as a variable reactance element often results in a waveform distortion due to the inherent nonlinear operating characteristic of the varactor. To eliminate such disadvantages the invention further contemplates the use of nonlinear compensating circuit.

BRIEF DESCRIPTION OF THE DRAWINGS

The invention will be further described with reference to the accompanying drawings, in which.

DETAILED DESCRIPTION

Figure 1:
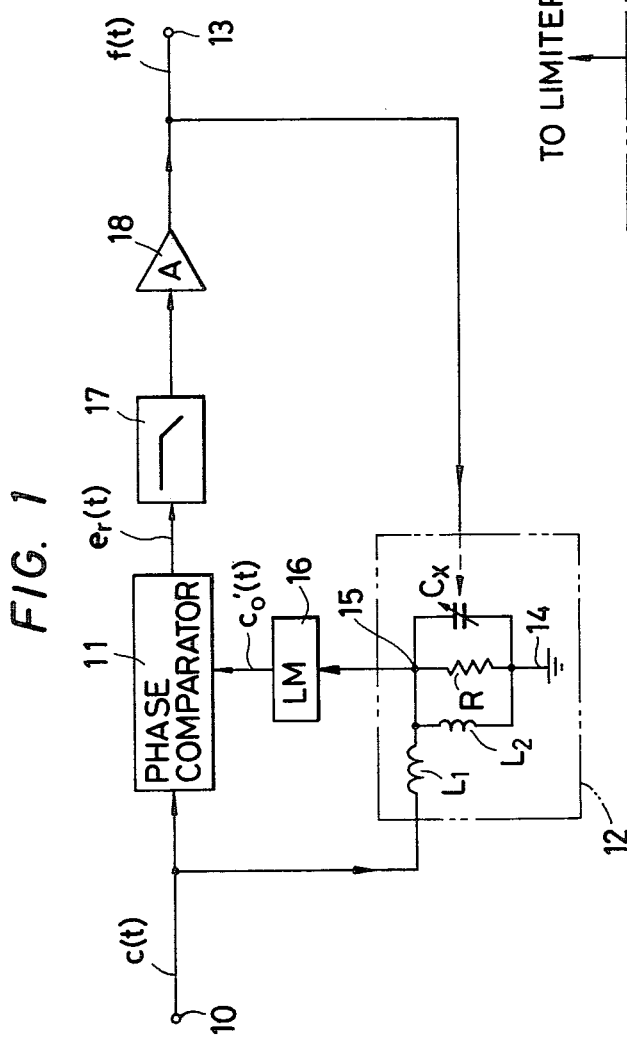
FIG. 1 is a circuit diagram of a first embodiment of the present invention.

FIG. 1 is an illustration of a first preferred embodiment of the invention. A frequency-modulated input signal C(t), which may have been affected by unwanted signals from neighbouring transmission channels, is fed to an input terminal 10 of the frequency demodulator of the invention, and thence to a first input of a phase comparator 11 which is constructed of an analog multiplier circuit. Concurrently, the input signal is applied to a variable shift lowpass filter 12, which according to the invention is designed to possess a sharp resonant peak near the upper frequency end of its passband spectrum with a 90 degree phase transition at the frequency of the peak. This filter is so constructed as to respond to a feedback control signal f(t) supplied from an output terminal 13 to vary the frequency of the peak so that it always corresponds to the instantaneous frequency of the input FM signal. The input signal thus undergoes a constant phase shift of 90° as it passes through the voltage controlled lowpass filter 12.

Through limiter 16 the output signal from the lowpass filter 12 is supplied to a second input of the phase comparator 11 wherein the two input signals, one of which has a phase lag of 90 degrees with respect to the other, are compared in phase to generate a voltage signal $e_r(t)$ representing the phase difference between them. The latter signal is then passed through a filter 17 having a transfer function G(S) to cut off the high frequency carrier components and applied through an amplifier 18 to the output terminal 13.

The lowpass filter 12 comprises an inductance element $L_2$, a resistor R and a variable reactance element such as a varactor $C_x$ all of which are connected in parallel between a ground terminal 14 and a circuit junction 15 which is connected through an inductor $L_1$ to the input terminal 10, the circuit junction 15 being also connected to the input of the limiter 16. The varactor $C_x$ is also connected to respond to the output signal f(t) to vary its capacitance value to shift the frequency of the resonant peak of the filter 12 for the purposes of keeping track of the instantaneous frequency of the FM signal applied thereto.

Figure 3:
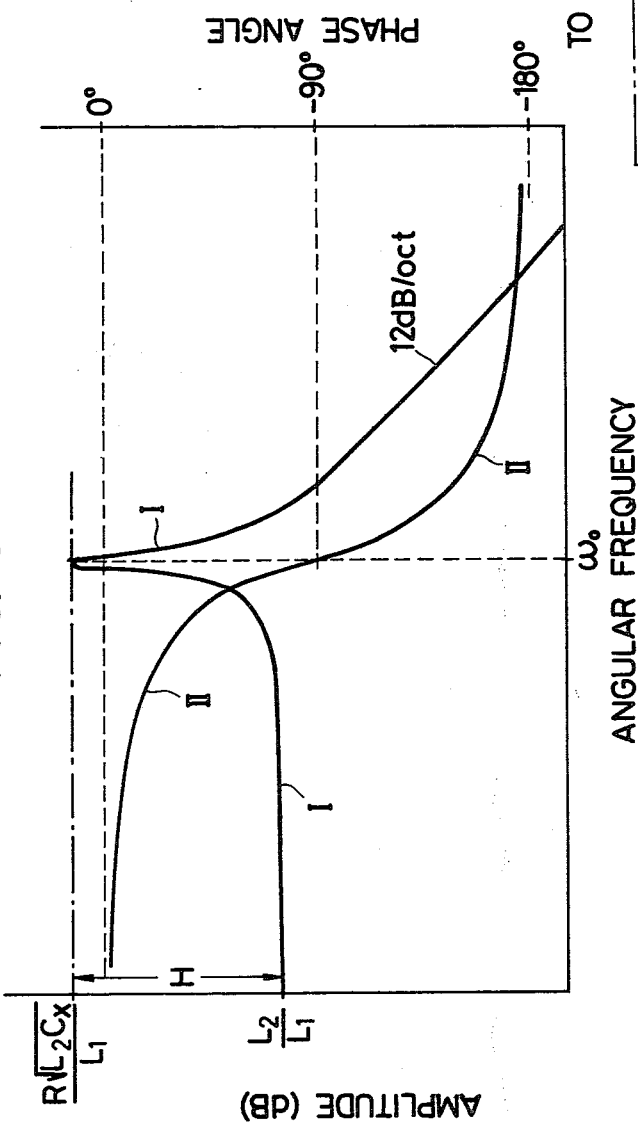
FIG. 3 is a graphic illustration of the operating characteristics of the variable shift lowpass filter of FIG. 1.

The operation of the FM demodulator of the invention will be understood from the following mathematical analysis: The lowpass filter 12 which is constructed as shown in FIG. 1 has a transfer function T(S) having a quadratic characteristic curve represented by the following Equation:

$$T(S) = \frac{1}{L_1 C_x S^2 + \frac{L_1}{R} S + (1 + \frac{L_1}{L_2})} \quad (1)$$

where $S(=j\omega)$ represents a Laplace transform operator. If inductance $L_1$ is much greater than inductance $L_2$ and resistance R is much greater than $\sqrt{L_2/2C_x}$, the amplitude and phase characteristics of the transfer function T(S) may be represented by curves I and II respectively shown in FIG. 3, in which $\omega_o$ represents the resonant angular frequency of the lowpass filter 12, and H represents the height of the resonant peak relative to the magnitude of a plateau which extends over the range of frequencies lower than the resonant frequency. The resonant frequency and the relative height of the peak are given by the following Equations 2 and 3, respectively:

$$\omega_o = 1/\sqrt{L_2 C_x} \ldots \quad (2)$$

$$H = R\sqrt{C_x/L_2} \ldots \quad (3)$$

It is necessary that H should be of a substantial value. This is obtained by suitably selecting the relative values of resistor R, varactor $C_x$ and inductor $L_2$.

On the other hand, the input FM signal is given by the following Equation:

$$C(t) = e^{j\{\omega c t + \int t \mu(\lambda) d\lambda\}} \ldots \quad (4)$$

where $\mu(\lambda)$ is the modulating signal and $\omega_c$ is the carrier frequency. It is to be noted that Equation 4 is valid provided that the frequency deviation caused by the modulating signal $\mu(t)$ is substantially smaller than the carrier frequency.

Assume that the capacitance of varactor $C_x$ is maintained at a constant value, the output signal $C_o(t)$ from the limiter 16 will be given as follows:

$$C_o(t) = e^{j\{\omega c t + \int t \mu(\lambda) d\lambda - \tau \mu(t) - \pi/2\}} = -je^{j\{\omega c t + \int t \mu_-(\lambda) d\lambda - \tau \mu(t)\}} \ldots \quad (5)$$

Since the capacitance of varactor $C_x$ is actually varied in accordance with the voltage signal f(t), the output $C_o'(t)$ from the limiter 16 is given as follows:

$$C_o'(t) = -je^{j\{\omega c t + \int t \mu(\lambda) d\lambda - \tau \mu(t) - \alpha f(t)\}} \ldots \quad (6)$$

where $\alpha$ represents the coefficient of a phase modulation of the FM signal which results from the variations of the capacitance $C_x$ in response to the signal f(t), and $\tau$ represents a group delay, given by Equation 7 below, imparted to the FM signal passing through the lowpass filter 12.

$$\tau = 2 C_x R \ldots \quad (7)$$

From Equations 5 and 6 it is seen that the FM signal undergoes a phase shift of 90° as it passes through the variable shift lowpass filter 12.

Although the circuit of FIG. 1 is shown including the limiter 16, this limiter can be omitted if the amount of the frequency deviation is very small as compared to the carrier frequency as described above since in this case the amplitude fluctuation of the output from the filter 12 is negligibly small.

The phase modulation coefficient $\alpha$ can be determined by inspecting what signal would appear when a nonmodulated carrier signal is applied to the variable shift lowpass filter 12. The capacitance of varactor $C_x$ is expressed as follows:

$$C_x = C_o + \Delta C f(t) \ldots \quad (8)$$

Assuming that when f(t)=0 the resonant frequency of the variable shift lowpass filter 12 equals to the carrier frequency $\omega_c$, then the carrier frequency is given as follows:

$$\omega_c = 1/\sqrt{C_o L_2} \ldots \quad (9)$$

The variable transfer function $T(j\omega, t)$ of the lowpass filter 12 is expressed as follows:

$$T(j\omega, t) = \frac{1}{j\frac{L_1}{R}\frac{1}{C_o L_2} - \frac{L_1}{L_2}\frac{\Delta C}{C_o} f(t)} \quad (10)$$
$$\omega = \omega_c$$

When the nonmodulated carrier $C_{nm}(t) = e^{j\omega c t}$ is applied to the variable shift lowpass filter 12, the output signal $C_{nm}'(t)$ is given by the following Equation:

$$C_{nm}'(t) = e^{j\{\omega c t - \tan^{-1}\left[\frac{\Delta CR}{\sqrt{C_o L_2}} f(t)\right] - \frac{\pi}{2}\}} \quad (11)$$

If the circuit elements of the variable shift lowpass filter 12 are suitably selected so as to meet the following Equation 12 provided $\Delta CRf(t)/\sqrt{C_o L_2}$ is much smaller than unity, the phase modulation coefficient $\alpha$ is given by Equation 13:

$$\tan^{-1}\left[\frac{\Delta CR}{\sqrt{C_o L_2}} f(t)\right] \approx \frac{\Delta CR}{\sqrt{C_o L_2}} f(t) \quad (12)$$

$$\alpha = \frac{\Delta CR}{\sqrt{C_o L_2}} \quad (13)$$

Since $C_o$ is much greater than $\Delta C$, Equation 7 can be rewritten as follows:

$$\tau = 2 C_o R \ldots \quad (14)$$

Equation 6 is rewritten as follows by substituting Equations 13 and 14 for the values of $\alpha$ and $\tau$:

$$C_o'(t) = -je^{j\{\epsilon c t + \int t \mu(\lambda) d\lambda - 2 C_o R \mu(t) - \frac{\Delta CR}{\sqrt{C_o L_2}} f(t)\}} \quad (6a)$$

The output signal $e_r(t)$ from the phase comparator 11 is thus expressed as follows:

$$e_r(t) = -\sin[2 C_o R \mu(t) + \frac{\Delta CR}{\sqrt{C_o L_2}} f(t)] \quad (15)$$
$$\approx -[2 C_o R \mu(t) + \frac{\Delta CR}{\sqrt{C_o L_2}} f(t)]$$

In Laplace notation, f(t), $e_r(t)$ and $\mu(t)$ are represented by F(S), $E_r(S)$ and M(S) respectively, and the following relation holds:

$$F(S) = G(S) \cdot E_r(S) \cdot A \qquad (16)$$
$$= -A \cdot G(S) [2C_o RM(S) + \frac{\Delta CR}{\sqrt{C_o L_2}} F(S)]$$
$$= \frac{-2C_o \cdot R \cdot A \cdot G(S)}{1 + \frac{\Delta CR}{\sqrt{C_o L_2}} \cdot A \cdot G(S)} M(S)$$

where A is the amplification gain of amplifier 18.

From Equation 16 it is seen that the signal from the output terminal 13 is the one that is same as is obtained by passing the frequency-modulating signal M(S) through a linear filter having a transfer function $-2C_o \cdot R \cdot A \cdot G(S)/(1+\Delta C \cdot R \cdot A \cdot G(S)/\sqrt{C_o L_2})$ so that Equation 16 demonstrates that the phase tracked loop circuit of the invention has a frequency demodulating function.

Figure 2:
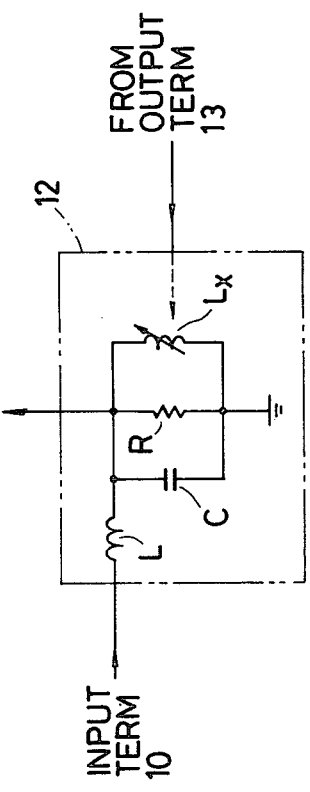
FIG. 2 is a modification of the circuit of FIG. 1.

FIG. 2 is an alternative embodiment of the invention in which the variable capacitance element $C_x$ of the previous embodiment is replaced with a variable inductance element $L_x$ and the inductance element $L_2$ is replaced with a capacitor C to serve as a constant value capacitive element of the variable shift lowpass filter 12.

Figure 4:
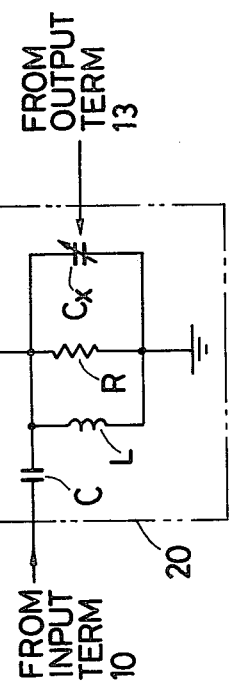
FIG. 4 is a circuit diagram of a second embodiment of the invention.

A modification of the embodiment of FIG. 1 is illustrated in FIG. 4 in which the variable shift lowpass filter 12 is replaced with a variable shift highpass filter 20. This highpass filter is generally similar in construction to filter 12 of FIG. 1 with the exception that a constant value capacitive element C is employed to substitute for the inductive element $L_1$. The highpass filter 20 has a resonant peak near the lower frequency end of the passband frequencies as indicated by curve I of FIG. 6 and a sharp transition in phase at the resonant peak as indicated by curve II. The mathematical analysis of the embodiment of FIG. 4 is generally similar to that described in connection with FIG. 1 with the following exceptions: The transfer function T(S) of the variable shift highpass filter 20 is expressed as follows:

$$T(S) = \frac{C \cdot L \cdot S^2}{L(C + C_x)S^2 + L S/R + 1} \qquad (1')$$

Figure 6:
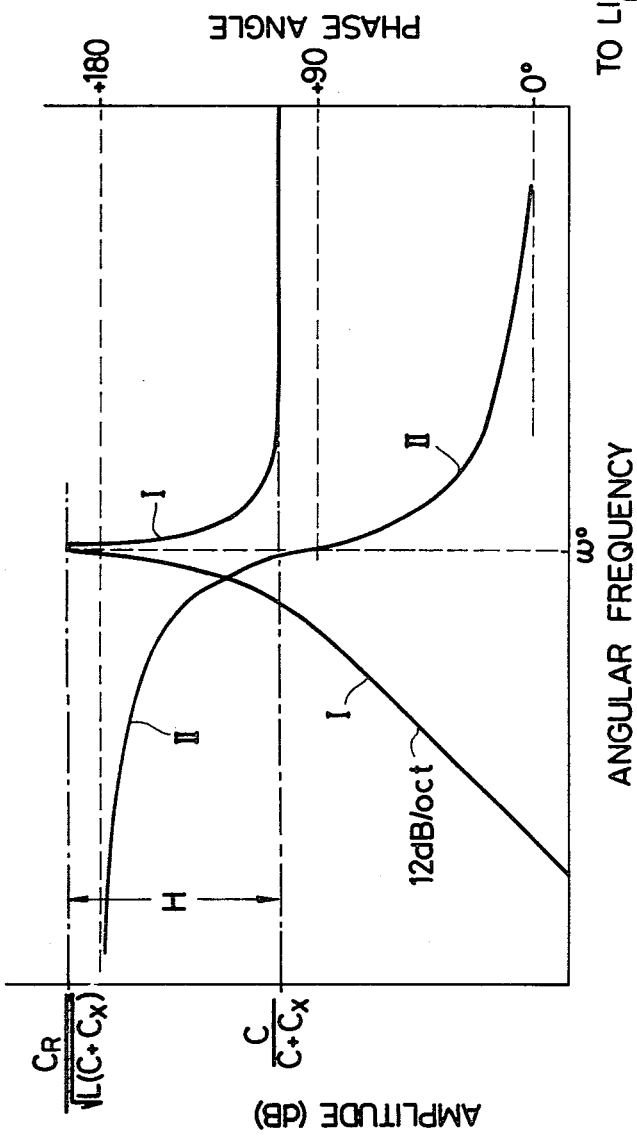
FIG. 6 is a graphic illustration of the operating characteristics of the variable shift highpass filter of FIG. 4.

If $C_x$ is much greater than C, the transfer function T(S) has the same frequency and phase characteristics as shown in FIG. 6. The resonant frequency $\omega_o$ and the value H are given as follows:

$$\omega_o = 1/\sqrt{L C_x} \ldots \qquad (2')$$

$$H = R\sqrt{C_x/L} \ldots \qquad (3')$$

As shown in FIG. 6, the highpass filter 20 imparts a phase shift of $-90°$ to a frequency modulated input signal applied thereto and by assuming that the frequency deviation is negligibly small as compared to the carrier frequency and that the varactor $C_x$ is held constant as in the previous assumption, the application of a frequency modulated signal represented by Equation 4 to the input terminal 10 results in an output signal $C_o(t)$ from the limiter 16 as given below:

$$C_o(t) = J e^{j\{\omega c t + \int t \mu(\lambda) d\lambda - \tau \mu(t)\}} \ldots \qquad (5')$$

Variation of the $C_x$ value as a function of f(t) then results in an output $C_o'(t)$ as given below:

$$C_o'(t) = +j\, e^{j\{\omega c t + \int t \mu(\lambda) d\lambda - \tau \mu(t) - \alpha f(t)\}} \ldots \qquad (6')$$

Equation 6' can be rewritten as follows:

$$C_o'(t) = +j e^{j\{\omega c t + \int t \mu(\lambda) d\lambda - 2 C_o R \mu(t) - \frac{\Delta CR}{\sqrt{C_o L}} f(t)\}} \qquad (6a')$$

Equation 6a' is similar to Equation 6a except that $L_2$ is replaced by L. Thus, the phase difference signal $e_r(t)$ is given by $$e_r(t) = -\sin[2C_o R\mu(t) + \frac{\Delta CR}{\sqrt{C_o L}} f(t)] \qquad (15')$$
$$\approx -[2C_o R\mu(t) + \frac{\Delta CR}{\sqrt{C_o L}} f(t)]$$

This results in Equation 16' which is similar to Equation 16 with the exception that $L_2$ is replaced with L.

$$F(S) = G(S) \cdot E_r(S) \cdot A \qquad (16')$$
$$= -A \cdot G(S) [2C_o RM(S) + \frac{\Delta CR}{\sqrt{C_o L}} F(S)]$$
$$= \frac{-2C_o \cdot R \cdot A \cdot G(S)}{1 + \frac{\Delta CR}{\sqrt{C_o L}} \cdot A \cdot G(S)} M(S)$$

Figure 5:
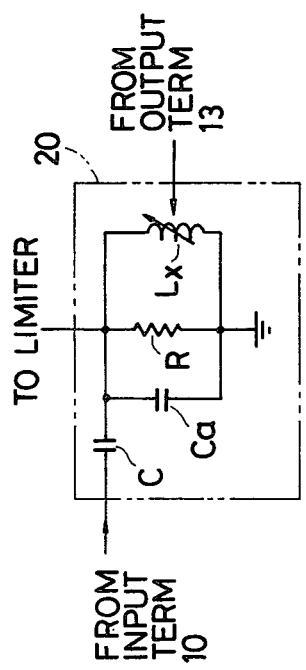
FIG. 5 is a modification of the circuit of FIG. 4.

FIG. 5 is an alternative circuit arrangement of the variable shift highpass filter 20 of FIG. 4. In FIG. 5 the variable capacitor $C_x$ is replaced with a variable inductor $L_x$ and the inductor L is replaced with a capacitor Ca.

In the embodiments of FIGS. 1 and 4, in which voltage-controlled capacitors, or varactors, are employed as variable reactance elements. However, the voltage vs. capacitance characteristic of the varactor is usually nonlinear and varies between different varactors. Such nonlinear operating characteristic results in a waveform distortion in the 90° phase shifted output signal from the variable peak shift filter and such distortion tends to become severe when a large amplitude control signal is applied to the varactor. More specifically, the positive and negative half cycle waveforms are suppressed or emphasized depending on the asymmetry of the operating characteristic curve of the varactor so that the output voltage will vary asymmetrically with respect to the zero voltage level, and give rise to a DC component in the output signal.

Figure 7:
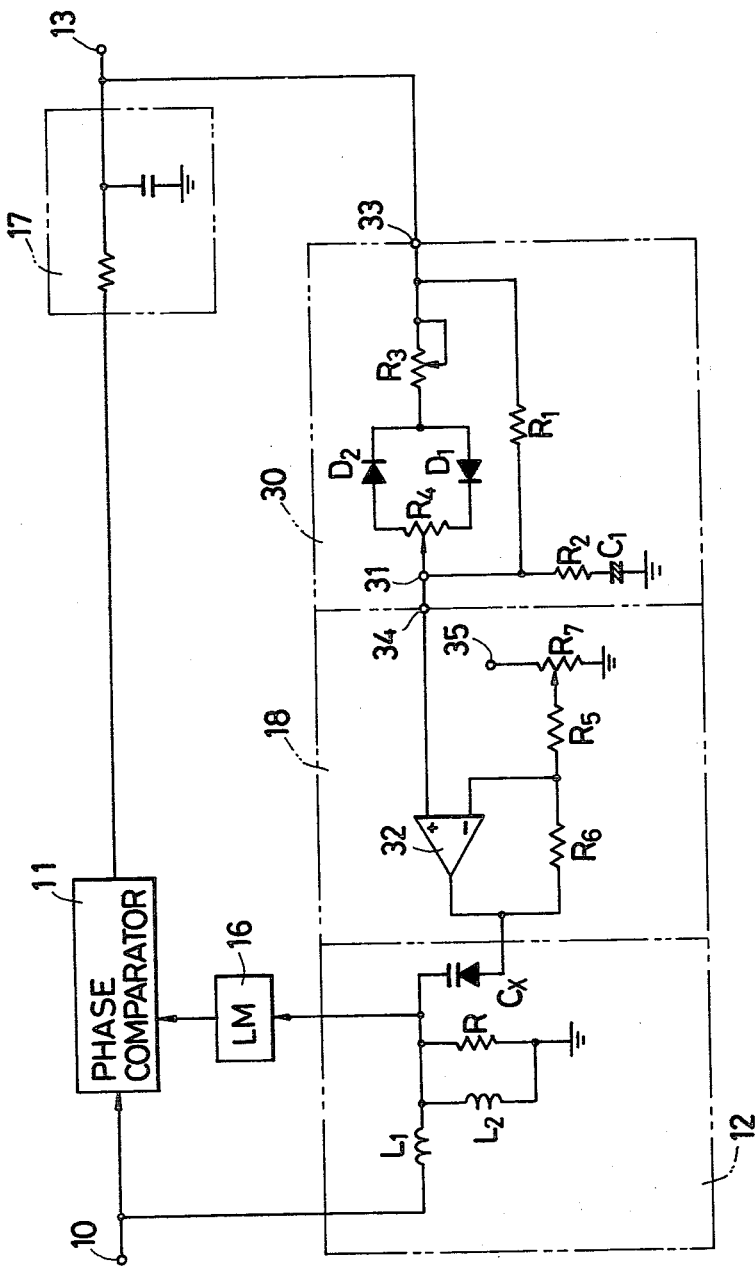
FIG. 7 is a circuit diagram of a modification of the embodiment of FIG. 1 for elimination of the waveform distortion of the demodulated signal.

For the purpose of overcoming the problem discussed above, a distortion compensating circuit 30 is shown included in the embodiment of FIG. 7 in which the same numerals are used to identify the same circuit elements used in the embodiment of FIG. 1. The distortion compensation circuit 30 comprises a variable resistor $R_3$ connected from the output terminal 13 to a pair of inversely parallel connected diodes $D_1$ and $D_2$ with a balancing variable resistor $R_4$ being connected beteen the cathode of diode $D_1$ and the anode of diode $D_2$. The wiper terminal 31 of the variable resistor $R_4$ is connected to the noninverting input of an operational amplifier 32 which forms part of the amplifier 18 of FIG. 1. A resistor $R_1$ is connected from the output terminal 13 to the wiper terminal 31 of resistor $R_4$ and thence to the common ground through a series circuit including a resistor $R_2$ and a capacitor $C_1$.

Variable resistor $R_3$ permits adjustment of the amplitude of the positive and negative half cycles of the feedback control current in equal proportions and provides a minimum amount of attenuation to the passing signal when the variable resistor $R_3$ has its wiper terminal moved to one of the extreme ends of its resistance. Variable resistor $R_4$ permits different adjustment of the current that passes through diode $D_1$ during its positive half cycle and of the current that passes through diode $D_2$ during its negative half cycle in order that the positive and negative half cycle currents are balanced against each other. Considering that the wiper terminal 31 is positioned so that it is directly coupled to the cathode terminal of diode $D_1$, the positive half cycle of the input signal is emphasized while the negative half cycle is suppressed to a substantial degree. Conversely, when the wiper terminal 31 is directly coupled to the anode terminal of diode $D_2$, the negative half cycle of the input signal is emphasized while the positive half cycle is suppressed to a substantial degree. Therefore, adjustment of the resistor $R_4$ provides a balance between the positive and negative half cycles of the feedback control signal and effectively compensates for the nonlinear waveform distortion.

The operational amplifier 32 has its inverting input terminal connected to a junction between a biasing resistor $R_5$ and a feedback resistor $R_6$ which are connected in series between the wiper terminal of a variable resistor $R_7$ and the output of the operational amplifier 32, the variable resistor $R_7$ being connected from a voltage source 35 and the common ground to supply a positive DC bias potential to the inverting input of amplifier 31. The output of the amplifier 32 is directly coupled to the varactor $C_x$ to control its capacitance with the distortion free, amplified control signal. The positive potential applied to the inverting input of amplifier 32 is inverted in polarity and appears as a negative DC component at the output of amplifier 32 to operate the varactor $C_x$ as a capacitive element.

Figure 8:
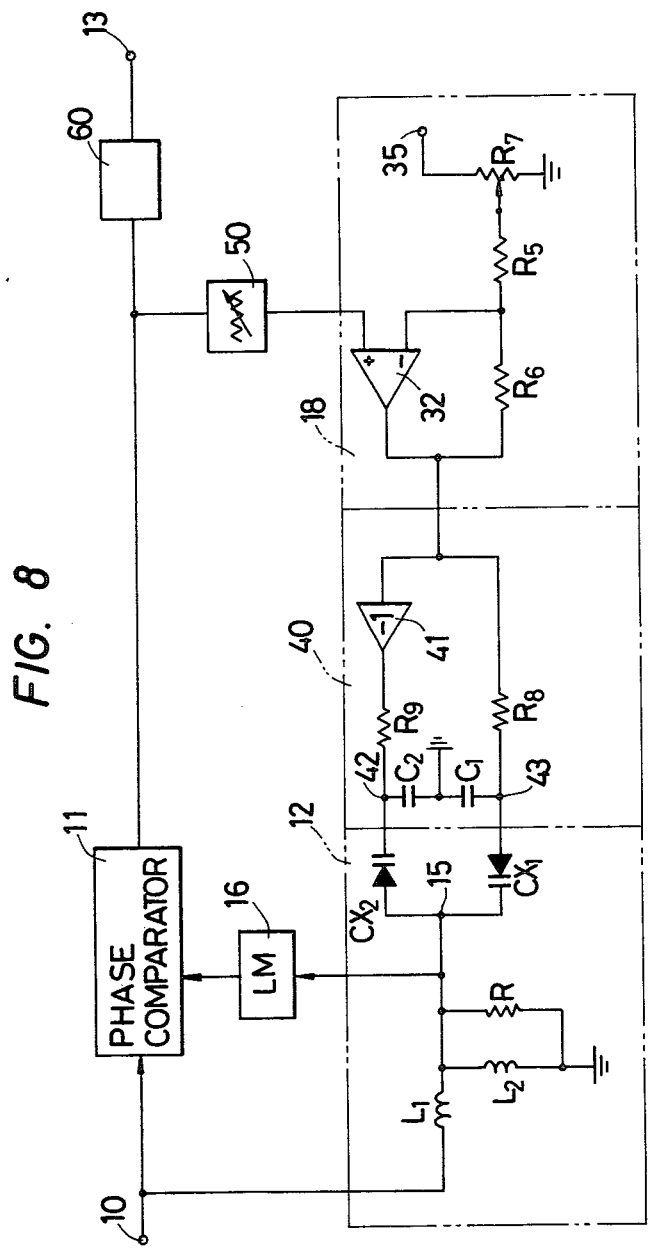
FIG. 8 is a circuit diagram of another modification of the embodiment of FIG. 1 for elimination of the waveform distortion.

If the input FM signal has a large amplitude, the problem of the nonlinearity of varactor will become severe. In FIG. 8, the variable peak shift filter is shown comprised of a lowpass filter which is similar to that shown in FIG. 1 except that it includes a pair of identical characteristic varactors $C_{x1}$ and $C_{x2}$ instead of a single varactor. These varactors are inversely parallel connected so that the anode of varactor $C_{x2}$ and the cathode of varactor $C_{x1}$ are connected together to the circuit junction 15. A compensating circuit 40 is provided between the output of the amplifier 18 and the lowpass filter 12 and includes a first resistor $R_8$ interposed in a first circuit path between the output of amplifier 18 and the anode of varactor $C_{x1}$ and an inverter 41 and a second resistor $R_9$ serially interposed in a second circuit path between the output of amplifier 18 and the cathode of varactor $C_{x2}$. Between junctions 42 and 43 is provided a pair of series-connected identical capacitors $C_1$ and $C_2$ with their junction connected to ground to form a pair of identical filters with resistors $R_8$ and $R_9$, which filters each possess the transfer function G(S) as described above to cut off the carrier frequency components in the respective circuit paths. An attenuator 50 is provided between the output of the phase comparator 11 and the noninverting input of the operational amplifier 32 to adjust the overall loop gain. Another high frequency elimination filter 60 is connected to receive the output signal from the phase comparator 11 to cut off the carrier frequency components prior to delivery to the output terminal 13.

The negative DC component of the output signal from amplifier 32 is coupled directly through the first circuit path to the varactor $C_{x1}$ on the one hand, and coupled through the second circuit path by the inverter 41 to the varactor $C_{x2}$ on the other hand, so that both varactors are negatively biased to operate as capacitive elements. Since the waveform of the control signal applied to the varactor $C_{x2}$ is inverted by inverter 41 and the varactor $C_{x2}$ is connected in opposite sense to varactor $C_{x1}$, both varactors are caused to vary in capacitance in the same direction. Because of their parallel connection the combined capacitance value is twice that of a single varactor. Being inversely parallel connected to the junction 15, both varactors are driven in opposite directions in response to the input FM signal so that variations of capacitances in response thereto are cancelled out at the output junction 15. Therefore, the combined operating characteristic of the varactors $C_{x1}$ and $C_{x2}$ is substantially flat over the full range of voltages of the input FM signal and provides twice the range of operation in response to the control signal as that available with the single varactor arrangement.

What is claimed is:

1. A phase tracked loop frequency demodulator comprising:
    a first filter having a quadratic amplitude characteristic as a function of frequency with a resonant peak which occurs at one end of the frequency range thereof, including a variable reactance element responsive to a control signal applied thereto to effect shifting of the frequency of said resonant peak, said filter being receptive of a frequency modulated signal to cause same to undergo a phase shift of 90° at the frequency of said resonant peak;
    a phase comparator for comparing in phase between said frequency modulated signal and said phase-shifted frequency modulated signal; and
    a feedback circuit connected to the output of said phase comparator for generating said control signal including a second filter for eliminating the carrier frequency components of the output signal from said phase comparator and an amplifier for amplification of the signal in the feedback circuit.

2. A frequency demodulator as claimed in claim 1, wherein said first filter is a lowpass filter having a resonant peak at the upper frequency end of the passband thereof.

3. A frequency demodulator as claimed in claim 1, wherein said first filter is a highpass filter having a resonant peak at the lower frequency end of the passband thereof.

4. A frequency demodulator as claimed in claim 2 or 3, wherein said first filter comprises a voltage-controlled variable capacitance element having a nonlinear operating characteristic and an inductive element connected in a resonant circuit relationship with said variable capacitance element, wherein said feedback circuit further includes a pair of inversely parallel connected first and second diodes and means in said parallel connection for manually controlling the amount of respective currents through said diodes to eliminate waveform distortions of said control signal resulting from the nonlinear characteristic of said variable capacitive element.

5. A frequency demodulator as claimed in claim 2 or 3, wherein said first filter comprises a pair of identical first and second voltage-controlled variable capacitive elements each having a cathode and an anode, the cathode of the first capacitive element being connected to the anode of the second capacitive element at a circuit junction which is connected to an inductive element in a resonant circuit relationship, an inverter for inverting the polarity of said control signal and applying the inverted control signal to the cathode of said second capacitive element, the anode of said first capacitive element being connected to respond to the noninverted control signal, and means for biasing said first and second capacitive elements so that they respond to said noninverted and inverted control signals by varying their respective capacitances in a same direction.

6. A frequency demodulator as claimed in claim 5, wherein said second filter comprises a first RC network interposed between the anode of said first capacitive element and the output of said amplifier and a second RC network interposed between the cathode of said second capacitive element and the output of said inverter.

7. A frequency demodulator as claimed in claim 5, wherein said biasing means and said amplifier comprise an operational amplifier arranged in a differential circuit configuration having a first input terminal connected to respond to the output of said phase comparator and a second input terminal biased at a DC potential which is further connected through a feedback resistor in said circuit configuration to the output terminal of said operational amplifier, the output terminal of said operational amplifier being connected to the input of said inverter and to the anode of said first capacitive element through respective circuit paths.

* * * * *